United States Patent [19]

Heimbach et al.

[11] 4,287,224
[45] Sep. 1, 1981

[54] METHOD FOR REGULATING THE EVAPORATION RATE OF OXIDIZABLE SUBSTANCES IN REACTIVE VACUUM DEPOSITION

[75] Inventors: Klaus-Jürgen Heimbach, Hattersheim; Walter Zültzke, Hanau, both of Fed. Rep. of Germany

[73] Assignee: Leybold-Heraeus GmbH, Bonner Straße, Fed. Rep. of Germany

[21] Appl. No.: 65,013

[22] Filed: Aug. 9, 1979

[30] Foreign Application Priority Data

Aug. 9, 1978 [DE] Fed. Rep. of Germany ....... 2834813

[51] Int. Cl.³ .......................... B05D 1/00; B05D 5/06
[52] U.S. Cl. ..................................... 427/42; 427/162; 427/164; 427/166; 427/167; 427/255.3
[58] Field of Search ................. 427/42, 162, 164, 165, 427/166, 167, 255.3, 10

[56] References Cited

U.S. PATENT DOCUMENTS 3,982,049 9/1976 Mee et al. ..................... 427/255.3 X

*Primary Examiner*—James R. Hoffman
*Attorney, Agent, or Firm*—Sprung, Felfe, Horn, Lynch & Kramer

[57] ABSTRACT

A process for regulating the evaporation rate of oxidizable substances in reactive vacuum deposition by the metered addition of oxygen to a vacuum deposition chamber during deposition, wherein the addition of oxygen to a predetermined value, the pressure "p" in the vacuum chamber is measured, and the evaporation rate "r" for any pressure changes is regulated such that the ratio of pressure to evaporation rate p:r is maintained substantially constant.

5 Claims, 1 Drawing Figure

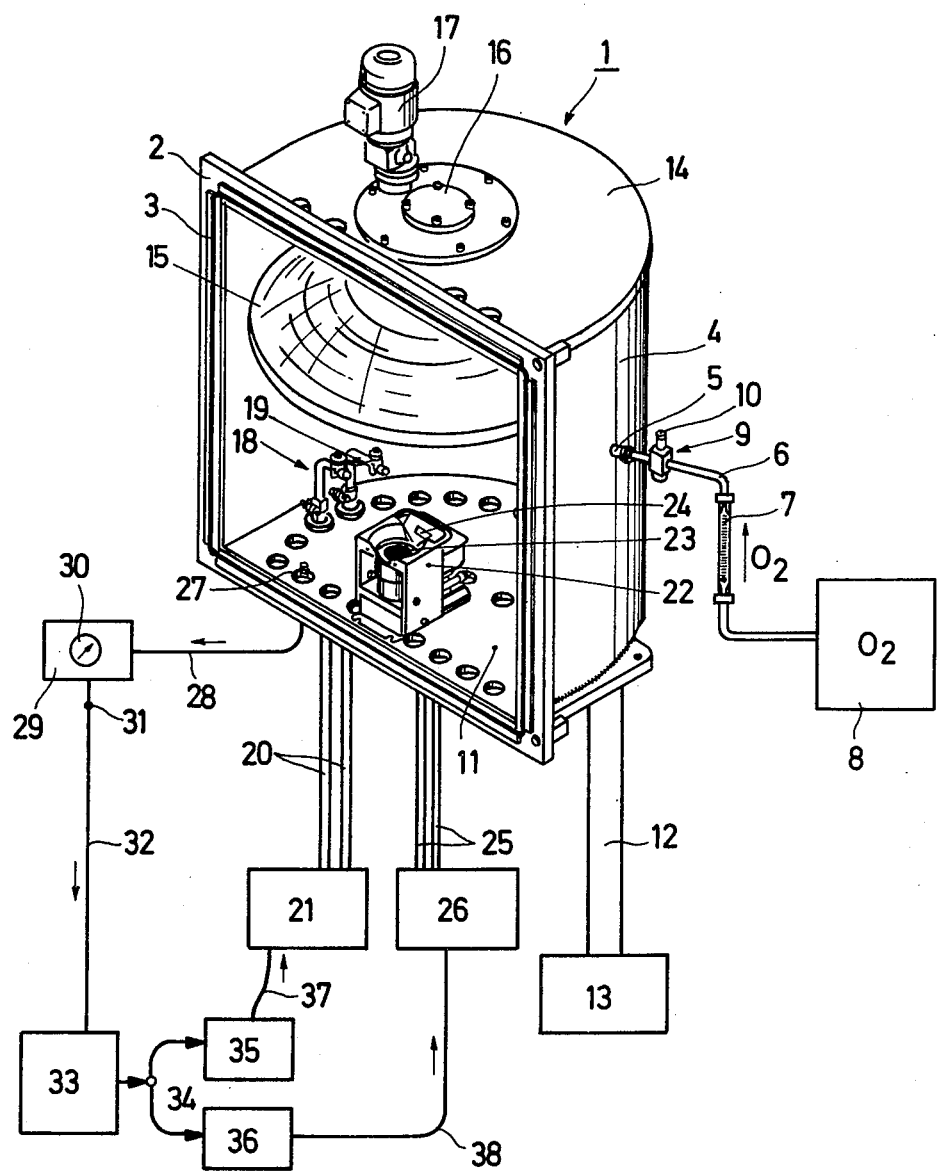

METHOD FOR REGULATING THE EVAPORATION RATE OF OXIDIZABLE SUBSTANCES IN REACTIVE VACUUM DEPOSITION

BACKGROUND OF THE INVENTION

The invention relates to a method for regulating the evaporation rate of oxidizable substances in reactive vacuum deposition by the metered addition of oxygen to a vacuum deposition chamber during deposition.

The quality, in particular the optical properties, of deposited oxide layers depends to a very great extent in reactive evaporation on the homogeneity of the layer material within the deposited layer. This applies particularly to deposited multiple layer systems, to which the so-called interference layer systems belong. If it is not possible to deposit layer by layer under the same conditions, i.e. to apply each layer with the same constant composition and at approximately the same deposition rate, then non-homogeneities arise, which adversely affect the dependency of the absorption and transmission behaviour on the light wavelength and in particular largely make it impossible to reproduce the method. The absorption and transmission behaviour over specific wavelength regions of light can be shown diagrammatically, and one talks of absorption and transmission curves.

A basic requirement for uniformity within the individual layers is the uniform oxidation of the layer material by the oxygen introduced into the vacuum chamber. Factors that interfere in the density or pressure of the oxygen in the vacuum deposition chamber are the suction capacities of the vacuum pumps connected to the vacuum chamber, the desorption of gases, changes in the amount of oxygen added per unit time, as well as the constant consumption of oxygen by the oxidation of the evaporant. On account of the continuous addition of oxygen and the continuous evacuation by the vacuum pumps, an equilibrium state is established, which of course may be subject to variations over the course of time. A fluctuating oxygen partial pressure leads, in the case of a constant evaporation rate, i.e. in the liberation of uniform amounts of evaporant per unit time, to a varying oxidation behaviour of the evaporant, with the result that the afore-described variations in the composition of the layer material occur.

Those skilled in the art have therefore always attempted to maintain the feed rate of oxygen to the vacuum chamber as constant as possible. This objective can however be only very unsatisfactorily achieved and at considerable expense and effort, on account of the regulation behaviour of the metering valves required for this purpose. On the other hand, those skilled in the art also attempted to maintain the evaporation rate of the evaporation source as constant as possible by regulating the electrical power. To this end, a whole number of so-called rate measuring devices were developed. However, the oxidation behaviour necessarily varied as a function of the amount of oxygen added per unit time.

SUMMARY OF THE INVENTION

The object of the invention is to provide a regulation method of the type described at the beginning, by means of which single layers and multiple layers of as homogeneous a degree of oxidation as possible can be obtained.

This object is achieved with respect to the method of the present invention by adjusting the addition of oxygen to a predetermined value, measuring the pressure in the vacuum chamber, and regulating the evaporation rate for any pressure changes such that the ratio of pressure to evaporation rate is maintained substantially constant.

The specified feature ensures that the ratio of oxygen per unit volume present in the vacuum chamber to the evaporation rate is maintained constant, i.e. the amount of evaporant released per unit time for the oxidation process is adapted to the amount of oxygen present. By virtue of the above-described equilibrium state, this also means that the ratio of the amount of oxygen added per unit time to the evaporation rate is likewise maintained constant. This constancy of the oxidation reaction leads to the desired homogeneous layers. As soon as the existing pressure measuring device establishes that the pressure in the vacuum chamber, preferably the oxygen partial pressure, falls, the evaporation rate is lowered by reducing the electrical power supplied, with the result that the afore-mentioned ratio is maintained constant, with the exception of a slight control deviation. If on the other hand the pressure measuring device records a pressure rise in the vacuum chamber, in particular in the oxygen partial pressure, the evaporation rate is appropriately regulated upwardly, the desired constancy of the afore-mentioned ratio thereby likewise being achieved. Evaporation materials include not only metals, but also complete or partial oxides of metals which would change as regards their chemical composition in a neutral atmosphere. The subject of the invention can be used in particular for producing dielectric layers of $TiO_2$, $SiO_2$.

The desorption rate of the container or vessel should be as low as possible. This is achieved by establishing a final vacuum that is smaller than $5 \times 10^{-6}$ mbars, before introducing the oxygen.

The subject matter of the invention can be developed still further by taking measures to ensure that the amount of oxygen is regulated to a constant value per unit time. For this purpose, there already exist metering valves that can automatically regulate a constant throughput (weight amount) per unit time. At a constant suction capacity of the vacuum pumps the introduction of such a measure means that the pressure in the vacuum deposition chamber is now affected only by a varying deposition rate, with the result that the pressure-dependent regulation only has to compensate for fluctuations in rate. In this way it is reliably ensured that the evaporation rate is also largely maintained constant, even though the regulation system, in contrast to the known rate regulation systems, would immediately respond to any change in the vacuum or oxygen partial pressure.

The so-called getter effect is largely compensated for by the feature according to the invention, which arises on account of the fact that some of the oxygen molecules are removed by a pure getter process from the vacuum deposition process by the precipitation of oxides.

The method according to the invention can also be used in the case of substances that additionally liberate oxygen in a reactive atmosphere, such as e.g. quartz. In this case the sign of the regulating signal is simply reversed, i.e. an increase in the pressure or partial pressure leads in this case to a reduction in the evaporation rate.

BRIEF DESCRIPTION OF THE DRAWING

One embodiment of an apparatus for carrying out the method according to the invention will be described in more detail hereinafter with respect to the accompanying FIGURE which shows a perspective view of the vacuum chamber and a schematic representation of the control system therefor.

DETAILED DESCRIPTION OF THE INVENTION

A vacuum deposition chamber 1 is provided on its front side with a sealing flange 2 and sealing strips 3, an appropriate counter flange of a door (not shown) being in contact therewith during operation. A pipeline 6 passes via a duct 5 through a cylindrical chamber wall 4, the pipeline being connected via a gasmeter 7 to an oxygen source 8. An automatically regulated metering valve 9 whose throughput can be adjusted by means of an adjustment knob 10 is located in the pipeline 6.

A suction pipe 12 of a vacuum pump unit 13 passes through a base plate 11. A spherical substrate holder 15 whose rotation shaft is fastened to a flange plate 16, is rotatably secured to an upper cover plate 14. The substrate holder 15 is rotated by means of a drive motor 17.

A resistance-heated evaporator 18 together with an evaporation vessel 19 is arranged beneath the substrate holder 15 on the base plate 11, the resistance of the vessel forming the so-called evaporator resistance. The evaporator 18 is connected via lines 20 to a regulable power supply unit 21. The current flow in the evaporation vessel 19 and thus the evaporation rate can be influenced by regulating the power supply. An electron beam evaporator 22 with an evaporation crucible 23 and an electron beam source 24, which latter is connected via lines 25 to a likewise regulable power supply unit 26, are also arranged on the base plate 11 beneath the substrate holder 15. The required high voltage and also the heating voltage for the cathode (not shown in more detail) of the electron beam source 24, are applied through the connecting lines 25. By altering the high voltage (accelerating voltage) and/or the heating voltage, it is possible to influence the output of the electron beam source and thus the evaporation rate of the evaporant located in the evaporation crucible 23.

The base plate 11 also accommodates a pressure measurement sensor 27 which corresponds to the pressure range and indication accuracy, and supplies an electrical measurement signal corresponding to the oxygen partial pressure via an electrical lead 28 to a pressure measuring device 29 equipped with a pressure indicator 30. The pressure measuring device 29 has an output 31 which is connected via an electrical lead 32 to a regulator 33. The regulator 33 has an output 34 which can be connected, preferably switched over, to a final control element or regulator 35 for the power supply unit 21, and to a final control element or regulator 36 for the power supply unit 26. The regulator 36 suitably influences the emission current of the cathode of the electron beam source 24.

The described apparatus operates in the following manner: by means of the vacuum pump unit 13, a pressure lower than $5 \times 10^{-6}$ mbar is initially produced in the vacuum deposition chamber 1. Such an amount of oxygen is then introduced per unit time into the container by means of the metering valve 9 that a pressure of $7 \times 10^{-4}$ mbar is established as an equilibrium state. As soon as the evaporation of oxidisable substances begins in the resistance-heated evaporator 18 or in the electron beam evaporator 22, the oxygen partial pressure in the vacuum deposition chamber 1 falls, and in fact to a pressure that corresponds to the desired deposition conditions. If now this pressure rises on account of some process or other, for example because too much oxygen flows through the metering valve 9, or because the evaporation rate decreases, then the pressure measurement sensor 27 in conjunction with the pressure measuring device 29 records this pressure rise and produces via the regulator 33 and the final control element 35 or 36 a correction which can be applied via the electrical leads 37 or 38 to the power supply unit 21 or 26. This now regulates the relevant evaporation process in the sense that the evaporation rate is increased, whereupon an increased oxygen requirement is established, which corresponds to the amount of oxygen added per unit time. On the other hand, a drop in pressure in the vacuum deposition chamber 1 results in a decrease in the deposition rate, with the result that this again corresponds to the reduced oxygen supply.

EXAMPLE

In an apparatus according to the FIGURE interference layer systems were produced in a reactive atmosphere on glass substrates by alternate deposition of $SiO_2$ and $TiO_2$. In this case a double-cup crucible in which the two deposition materials were accommodated separately was held in the electron beam evaporator 22. By rotating the evaporation crucible 23 one of the evaporation substances could be brought into the path of the electron beam emitted from the electron beam source 24. An oxygen pressure of $7 \times 10^{-4}$ mbar was established by means of the metering valve 9, after the vacuum deposition chamber 1 had firstly been evacuated to a pressure of $3 \times 10^{-6}$ mbar. The deposition materials were first of all melted under a diaphragm or aperture, not shown. The emission current of the electron beam source 24 was thereby initially limited by a preset boundary value. After the melting process, a predetermined oxygen partial pressure was established by means of the final control element 36 via the emission current. The regulator 33 now held the ratio of oxygen partial pressure to the evaporation rate constant in the afore-mentioned regulation sense. As soon as a layer of one of the layer materials had been deposited with a layer thickness of a quarter wavelength, the next following layer was produced in a similar manner with the second deposition material. Since the desired value of the pressure differed with respect to the different materials, this fact was taken into account by means of a different predetermined desired pressure value. The individual steps of the deposition process were terminated by turning the diaphragm, not shown. The diaphragm itself was controlled by a photometer, likewise not illustrated, as a function of the layer thickness. Layer thickness measurement techniques and diaphragm control are however part of the state of the art, and accordingly do not need to be discussed in more detail here.

The layers produced are characterized both individually and in their totality as layer systems by a high degree of homogeneity and a very good reproducibility with different batches.

We claim:

1. In a process for regulating the evaporation rate of oxidisable substances in reactive vacuum deposition by the metered addition of oxygen to a vacuum deposition chamber during deposition, the improvement comprising: adjusting the addition of oxygen to a predetermined value, measuring the pressure in the vacuum chamber, and regulating the evaporation rate for any pressure changes such that the ratio of pressure to evaporation rate is maintained substantially constant.

2. The method according to claim 1, wherein the adjusting of the addition of oxygen comprises regulating the amount of oxygen to a constant value per unit time.

3. The method according to claim 1, in a resistance-heated evaporator, further comprising regulating the current flowing through the evaporator resistance in a pressure-dependent manner.

4. The method according to claim 1, in an electron beam evaporator, further comprising regulating the emission current of the cathode in a pressure-dependent manner.

5. The method according to claim 1, further comprising measuring the oxygen partial pressure.

* * * * *